United States Patent [19]

Keizer et al.

[11] 4,296,371

[45] Oct. 20, 1981

[54] SYSTEM FOR MEASURING STYLUS SHOE LENGTH

[75] Inventors: Eugene O. Keizer; Gerard A. Alphonse, both of Princeton, N.J.

[73] Assignee: RCA Corporation, New York, N.Y.

[21] Appl. No.: 131,044

[22] Filed: Mar. 17, 1980

[51] Int. Cl.³ ............................................. G01R 27/26
[52] U.S. Cl. .................................. 324/61 R; 369/55; 369/126; 369/151
[58] Field of Search ............... 324/61 R; 369/55, 126, 369/151; 358/128.5

[56] References Cited

U.S. PATENT DOCUMENTS

| | | |
|---|---|---|
| 3,842,194 | 10/1974 | Clemens . |
| 3,872,265 | 3/1975 | Hilliker . |
| 4,080,625 | 3/1978 | Kawamoto . |
| 4,104,832 | 8/1978 | Keizer . |
| 4,152,641 | 5/1979 | Hughes et al. ..................... 324/61 R |
| 4,199,782 | 4/1980 | Wada et al. ......................... 369/126 |

Primary Examiner—Stanley T. Krawczewicz
Attorney, Agent, or Firm—Birgit E. Morris; Donald S. Cohen; Thomas H. Magee

[57] ABSTRACT

A system for measuring shoe length of a stylus adapted to track a path along a surface of a video disc comprises positioning the tip of the stylus adjacent the surface of a substrate having a signal therein for effecting capacitive variations between the stylus and the substrate, and measuring the capacitive variations between the stylus and the substrate while they are oriented in a first position to obtain a first signal. The stylus is then tilted an angle of $\theta$ degrees relative to the substrate, whereby the stylus and substrate are oriented in a second position relative to each other. The capacitive variations are measured while the stylus and substrate are oriented in the second position to obtain a second signal. The first signal is then compared with the second signal to obtain a difference signal proportional to the shoe length of the stylus.

23 Claims, 6 Drawing Figures

SYSTEM FOR MEASURING STYLUS SHOE LENGTH

This invention relates to a system for measuring shoe length of a stylus adapted to track a path along a surface of a video disc and measure capacitive variations between the stylus and the disc.

BACKGROUND OF THE INVENTION

In U.S. Pat. No. 3,842,194, issued to John K. Clemens, on Oct. 15, 1974, and assigned to RCA Corporation, a video disc playback system of a variable capacitance form is disclosed. In one embodiment described therein, a capacitive pickup is utilized to read signals from the surface of an information record, typically a plastic disc similar to an audio disc, that contains stored video and audio information. The information record in the above embodiment has a fine spiral groove to guide a stylus that contains a thin electrode (about 0.2 micrometer thick), and the video and audio information is stored in the form of depressions in the bottom of the groove. The groove is typically about 2.7 micrometers in width and about 0.5 micrometer in depth. For the signal to be detected capacitively with a high quality, the information record itself is conducting or has a conductive layer on it. The stored information is read by measuring the capacitive variations between the electrode on the stylus and the surface of the record. Detection of the small capacitive variations is performed by forming a resonant circuit with the stylus-record capacitance. Pickups made in this manner can resolve signal elements signficantly smaller than the wavelength of light with sufficient reliability to reproduce high quality video and audio signals.

In systems of the above type, the stylus has a tip at one end thereof adapted to track a path along the surface of the information record and to measure capacitive variations between the stylus and the surface of the record when relative motion is established between the stylus and the record. In embodiments where the stylus tracks a groove and supports an electrode that is coated on its trailing face, the stylus may be made of either sapphire or diamond. The shape of the stylus tip forms a footprint. Many shapes are possible, and the footprint dimensions are quite variable, although extremely small. Typically, the stylus tip has a prow or front portion terminating at a base thereof, and a stern or back portion remote from the prow. The prow and stern, along with a pair of side surfaces, usually define the shape of the bottom portion (footprint), with the shoe length of the stylus being the distance between the base and the stern along a line tangent to the path at the tracking location.

In the video disc playback system, the shoe length of the stylus is about 3 to 4 micrometers. In the mass production of video disc playback styli there is a need for rapid measurements of stylus shoe length. Such a measurement system must be suitable for controlling or measuring the stylus shoe length during high volume production or testing of the styli. This is particularly true in the final lapping process wherein a V-shaped lap is formed in the bottom portion of the stylus tip. The present invention provides a novel system for rapidly measuring stylus shoe length during a manufacturing operation.

SUMMARY OF THE INVENTION

The present invention comprises a method and apparatus for measuring shoe length of a stylus having a tip at one end thereof. The tip includes a prow terminating at a base thereof and a stern remote from the prow, and is adapted to track a path along a surface of an information record and to measure capacitive variations between the stylus and the surface of the record when relative motion is established between the stylus and the record. The shoe length is defined as the distance between the base and the stern along a line tangent to the path at the tracking location. The novel method comprises the steps of positioning the tip of the stylus adjacent the surface of a substrate having a signal therein for effecting capacitive variations between the stylus and the substrate, and measuring the capacitive variations between the stylus and the substrate while the stylus and the substrate are oriented in a first position to obtain a first signal. The orientation of the stylus relative to the substrate is then changed an angle of $\theta$ degrees about an axis passing through the base of the prow in a direction parallel to the surface of the substrate and perpendicular to the direction of the shoe length in order to change the distance of the stern from the substrate, whereby the stylus and the substrate are oriented in a second position relative to each other. While the stylus and the substrate are oriented in this second position, the capacitive variations between the stylus and the substrate are measured to obtain a second signal. The first signal is then compared with the second signal to obtain a difference signal proportional to the shoe length of the stylus.

DETAILED DESCRIPTION OF THE INVENTION

Figure 1:
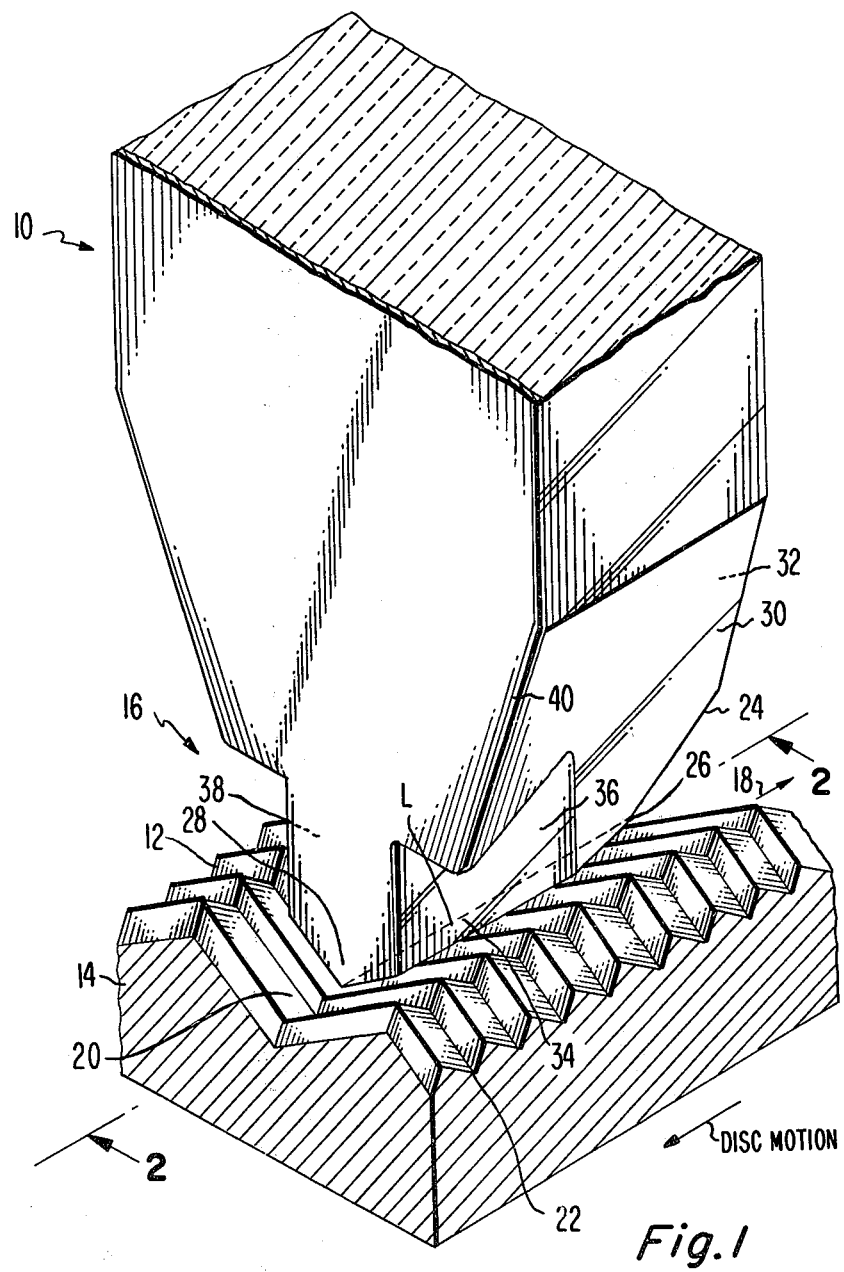
FIG. 1 is a perspective view showing one embodiment of a stylus tip tracking a groove in a surface of a video disc record.

In FIG. 1 of the drawing, there is shown one embodiment of a stylus 10 utilized to read signals from a surface 12 of an information record 14. The stylus 10 has a tip 16 at one end thereof adapted to track a path along the surface 12 of the record 14, shown in the direction of the arrow 18, and to measure capacitive variations between the stylus 10 and the surface 12 of the record 14 when relative motion is established between the stylus 10 and the record 14. The entire stylus 10, or the tip 16 alone, may be made of either sapphire or diamond. In the present example, the information record 14 comprises a plastic disc, impregnated with carbon to make it partially conductive, which has a fine spiral groove 20 in the surface 12 thereof utilized to guide the tip 16 of the stylus 10 during playback. The video and audio information is stored in the form of geometric variations 22 of adequate fineness of dimension within the groove 20 to accommodate recovery of the information via capacitive variations when relative motion is established between the stylus 10 and the record 14. Although the present embodiment discloses the use of a groove 14 for tracking purposes, the present invention does not require a groove and may be practiced in other embodiments, such as those wherein the tracking is performed by optical means.

The tip 16 of the stylus 10 includes a prow 24 terminating at a base 26 thereof, and a stern 28 remote from the prow 24. Although shown in FIG. 1 as a line formed by the intersection of two surfaces, the prow 24 may also comprise a single curved or planar surface. The prow 24 and stern 28, along with two nonparallel side surfaces 30 and 32 of the tip 16, define a substantially triangular-shaped bottom portion 34 or shoe which is lapped in the shape of "V" to match the shape of the groove 20 in the record 14. In the present embodiment, the side surfaces 30 and 32 are also lapped to form a keel defined by the bottom portion 34 and two substantially parallel side surfaces 36 and 38, as shown in FIG. 1. The shoe length L is defined as the distance between the base 26 and the stern 28 along a line tangent to the path (arrow 18) at the tracking location. In the present embodiment, the stern 28 of the tip 16 has a thin electrode 40 disposed adjacent thereto. The electrode 40 may comprise a metallic film, having a thickness of about 0.2 micrometer, deposited adjacent the stern, as shown in FIG. 1, or may comprise, for example, a conductive region in the tip 16 formed by implantation of conductive ions.

In the present embodiment, the playback system is designed so that the capacitance between the record 14 and the electrode 40 of the stylus 10 is part of the resonant tank of a 915 MHz oscillator, as explained further below. The depth variations 22 in the groove 20 due to the signal therein are translated into capacitive variations that modulate the oscillator's frequency. The oscillator's signal is then demodulated to recover the recorded signal. The amplitude $g(h,\lambda)$ of the signal thus obtained, i.e., the response of the stylus 10, is a function of its altitude h and the wavelength $\lambda$ of the groove variations 22 according to the following expression:

$$g(h,\lambda) = (h_o/h)e^{-2\,h/\lambda} \quad (1)$$

where $h_o$ is some reference altitude. By substituting $f/v$ for $1/\lambda$, and $2\pi rn$ for v, where v is the tangential velocity of the stylus 10 relative to the record 14, r is the radius of the groove 20 at the tracking location, and n is the rotation frequency (revolutions/second) of the record 14, equation (1) becomes:

$$g(h,f) = (h_o/h)e^{-hf/rn} \quad (2)$$

where f is the signal frequency in Hz. In decibels (dB) one has:

$$G(h,f) = (20) \log [g(h,f)]$$

$$G(h,f) = (20) \log [(h_o/h)e^{-hf/rn}]$$

$$G(h,f) = (20) \log (h_o/h) - (hf/rn)(20) \log e \quad (3)$$

In the present novel method, it is proposed to use the change (loss) of signal for a given amount of tilt of the stylus 10 about the prow 24 as a measure of the shoe length L. Theory predicts that the tilting causes signal attenuation which is frequency sensitive and can be related to the shoe length. The loss of signal is a strong function of the electrode-to-record separation, which in turn is directly related to the length of the shoe. For symmetrical shoes (i.e., ones where the shoe and prow 24 are symmetrical with respect to the groove 20) with straight front-to-back profiles of the bottom of the shoe from a side-on view of the stylus tip 16, the separation for a given angle of tilt is directly a function of the length, after allowing for a dimple in the record 14 under the prow 24 and for the effective thickness of any dielectric spacing (vinyl, oil, or air) between the conductive surface of the record 14 and the bottom edge of the electrode 40. In the present method, the stylus 10 may be tilted by some angle $\theta$ about the prow 24, so that the altitude h of the stern 28, or distance of the electrode 40 from the record 14 in the present embodiment, changes from $h_1$ to $h_2$, thereby causing a change in the capacitive variations between the electrode 40 and the record 14. This altitude difference, $h_2 - h_1$, may be expressed as follows:

$$h_2 - h_1 = L \sin \theta$$

or $$L = (h_2 - h_1)/\sin \theta \quad (4)$$

where L is the shoe length of the stylus 10. We have performed tests which show that for a 2° tilt with styli having shoes approximately 4 micrometers long, both the 8 MHz and the 2 MHz response fall, but the 8 MHz response falls nearly 10 dB more than the 2 MHz response.

In order to use equation (4) along with equation (3) to determine shoe length L of the stylus 10, it is necessary to obtain from equation (3) a quantity that depends upon the altitude h only. The desired quantity can be obtained by observing that the gain G in decibels is linearly proportional to the frequency f, and that the slope of this linear relationship is proportional to the altitude h. This slope is given by the differential of G with respect to f in equation (3) as follows:

$$\Delta G/\Delta f = -20 (\log e) h/rn$$

or $$h = -(rn\Delta G)/20 (\log e)\Delta f \quad (5)$$

By substituting equation (5) for h in equation (4), one obtains the following:

$$L = \frac{rn(\Delta G_1 - \Delta G_2)}{20 (\log e)\Delta f(\sin \theta)} \quad (6)$$

Equation (6) is utilized in performing our novel method as explained below.

Figure 2:
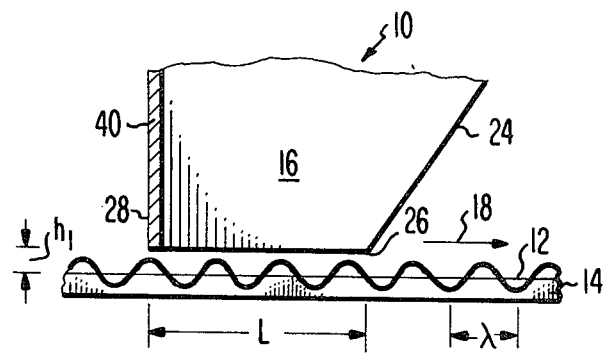
FIGS. 2 and 3 are cross-sectional views illustrating two different stylus orientations utilized in measuring the stylus shoe length.

FIG. 2 illustrates the first step of the present novel method comprising positioning the tip 16 of the stylus 10 adjacent the surface of a substrate to allow capacitive coupling, between the stylus 10 and the substrate acting as capacitive electrodes, to produce an output signal at one capacitive electrode in response to an input signal at the other capacitive electrode. The substrate may comprise the other capacitive electrode and may have an input signal therein for effecting capacitive variations between the stylus 10 and the substrate. In the present embodiment, the substrate comprises the information record 14. The record 14 is a plastic video disc containing a base band 1 (BB1) test signal therein comprising a 5 MHz carrier frequency modulated with a 3 MHz sine wave, the 5 MHz carrier frequency having lower and upper sidebands centered at 2 MHz and at 8 MHz, respectively. Although a specific test signal is utilized in the present embodiment, the present method may also be used wherein the signal in the record 14 comprises simply the background noise.

The amplitude of the output signal is measured while the stylus 10 and the information record 14 are oriented in a first position to obtain a first signal $G_1$. In the present embodiment, this measuring step is performed by measuring the capacitive variations between the stylus 10 and the information record 14 while they are oriented in the first position. The first position may comprise the normal position during playback characterized by the direction of the shoe length being substantially parallel to the surface of the record 14, as shown in FIG. 2. The record 14 is actually coated with a lubricant, and the bottom portion 34 or shoe rides over the lubricant on the groove 20 at the altitude $h_1$.

Figure 3:
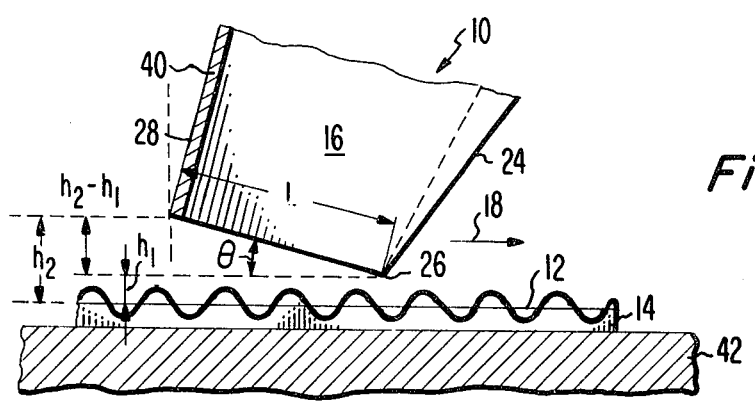

After obtaining the first signal $G_1$, the orientation of the stylus 10 relative to the record 14 is changed an angle of $\theta$ degrees about an axis passing through the base 26 of the prow 24 in a direction parallel to the surface 12 of the record 14 and perpendicular to the direction of the shoe length. This causes the distance of the stern 28 from the record 14 to change, whereby the stylus 10 and record 14 are oriented in a second position relative to each other, as illustrated in FIG. 3. This changing step may be performed by simply rotating a tilting platform 42, disposed adjacent the information record 14, an angle of $\theta$ degrees. In the present embodiment the stylus 10 is supported by a tracking arm enclosed in a pickup cartridge attached to an armlike housing (described further below), and the changing step is performed by tilting the cartridge relative to the housing an angle of $\theta$ equal to about 2 degrees.

The capacitive variations are again measured between the stylus 10 and the information record 14 while the stylus 10 and record 14 are oriented in the second position to obtain a second signal $G_2$. The first signal $G_1$ is then compared with the second signal $G_2$ to obtain a difference signal, $G_1-G_2$, which is proportional to the shoe length L of the stylus 10.

Figure 4:
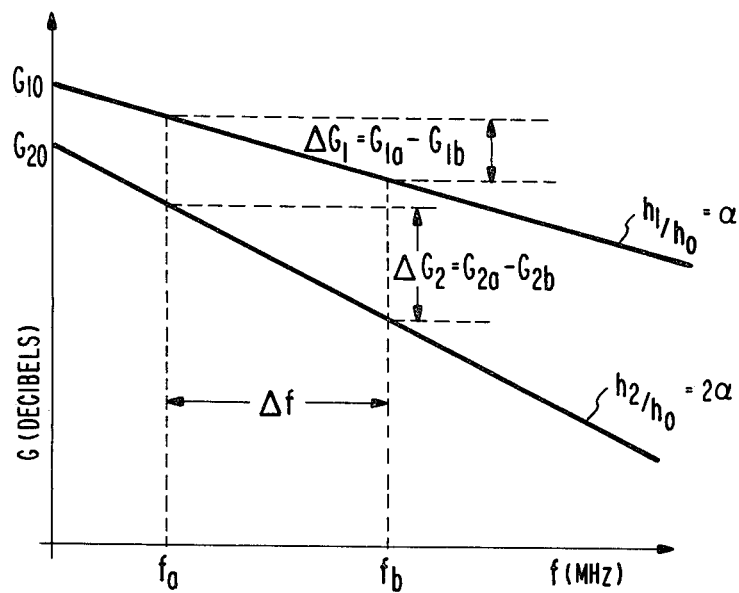
FIG. 4 is a diagram of the signal response G in decibels as a function of the frequency f for the two different stylus orientations.

FIG. 4 of the drawing shows a plot of G as a function of f, in accordance with equation (3), for two distinct values of h equal to $\propto h_o$ and $2\propto h_o$, where $\propto$ is some constant. For a constant tangential velocity the slope of the curve is a function of the altitude h only, and can be measured experimentally. Although it is possible to measure the shoe length L of the stylus 10 by simply comparing the first signal $G_1$ and the second signal $G_2$ at a particular frequency f, such a technique depends upon parameters in the playback system which may not remain constant. In order to reduce the effect which these variable parameters may have on our novel measurement technique, we prefer an embodiment wherein each measurement step is performed by splitting the recovered signal between two filters to obtain two distinct filtered signals, and the subtracting one filtered signal from the other filtered signal to obtain an aperture signal $\Delta G$.

For example, one may utilize a record 14 containing a signal which occupies a bandwidth of several MHz including lower and upper sidebands of equal amplitude centered at a first and a second frequency, respectively. As previously mentioned, the record 14 may contain the BB1 test signal comprising a 5 MHz carrier frequency modulated with a 3 MHz sine wave, the 5 MHz carrier frequency having lower and upper sidebands centered at 2 MHz and at 8 MHz, respectively. Each of the measuring steps is then performed by splitting the recovered signal between a first filter passing only the 2 MHz centered frequency, $f_a$, and a second filter passing only the 8 MHz centered frequency, $f_b$. The two filtered signals, $G_a$ and $G_b$, are then substracted from each other to obtain the aperture signal $\Delta G$ equal to $G_a-G_b$, whose value is dependent upon only the altitude h and the known frequency difference $f_b-f_a$, and not other system parameters. In our present novel method, the difference signal then comprises the difference between the first aperture signal $\Delta G_1=G_{1a}-G_{1b}$, measured at the first position, and the second aperture signal $\Delta G_2=G_{2a}-G_{2b}$, measured at the second position, i.e., $\Delta G_1-\Delta G_2$. Consequently, by using a signal such as the BB1 signal, the slope at each position is easily measured from the aperture signal $\Delta G$, and dB between the 2 MHz and 8 MHz components, and from the frequency difference $\Delta f$, equal to 6 MHz. Thus, from equation (6) the shoe length L may be obtained:

$$L = \frac{rn(\Delta G_1 - \Delta G_2)}{20 (\log e)\Delta f(\sin \theta)}$$

where $\Delta G_1$ and $\Delta G_2$ are the aperture signals in dB at the normal or first position and the tilted or second position, respectively. For example, considering the 2 MHz and 8 MHz sidebands of a BB1 signal, and letting $r=0.127$ m (5"), $n=7.5$ rev/sec (450 rpm) and $\theta=1.22°$, then $\Delta G_1-\Delta G_2$ varies from 0 dB to 4.64 dB as the stylus shoe length increases from 0 to 4 micrometers.

The present novel method may further comprise the step of transmitting such a difference signal, $\Delta G_1-\Delta G_2$, to processing means for comparing the difference signal with a predetermined value, or to output the actual value of the shoe length. Such a method may be performed in conjunction with the step of lapping the tip 16 of the stylus 10, wherein the processing means terminates the lapping when the difference signal equals the predetermined value. In the present embodiment, it is desired to reliably lap the stylus 10 until the shoe length L is about 4 micrometers in length. The difference signal, $\Delta G_1-\Delta G_2$, is utilized to either continue the lapping process, or to terminate it when the shoe length reaches 4 micrometers by having the predetermined value comprise a maximum value at which the difference signal correlates wih a shoe length of about 4 micrometers. The lapping means may comprise either a special groove in the information record 14 itself, or a separate lapping station having a second independent turntable, as explained further below.

Figure 5:
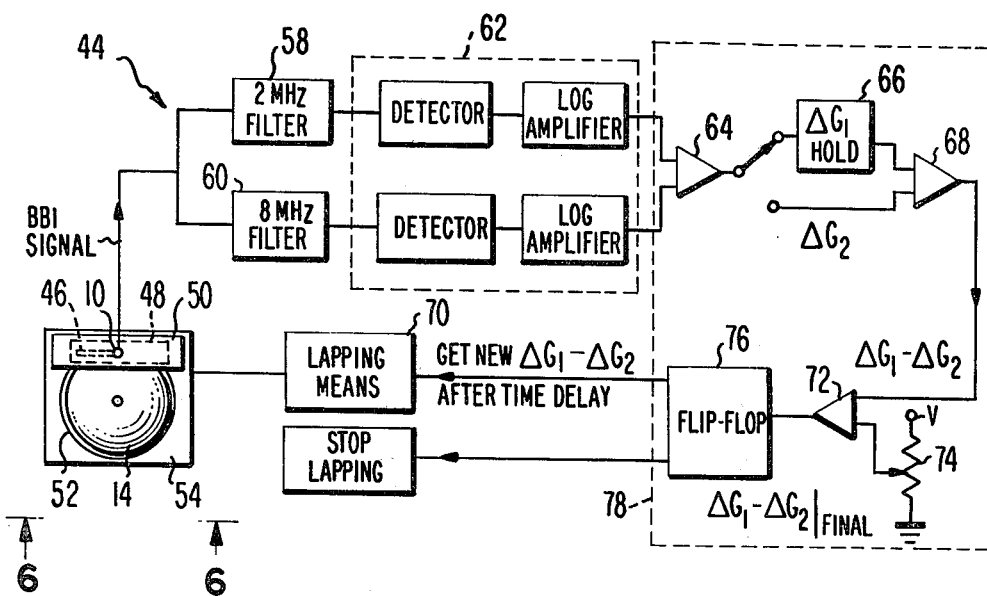
FIG. 5 is a block diagram illustrating one embodiment of a system for measuring the stylus shoe length.
Figure 6:
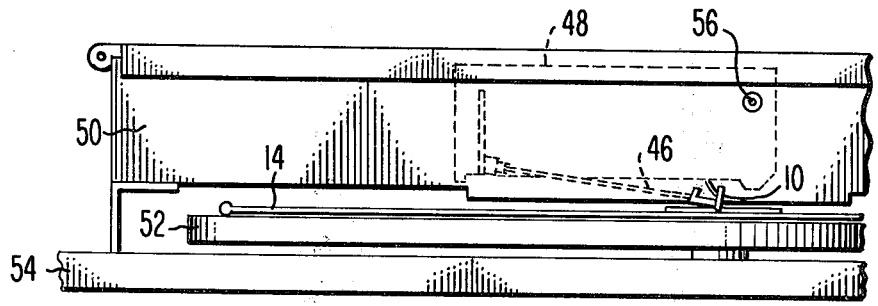
FIG. 6 is a partial cross-sectional view taken along line 6—6 of FIG. 5.

FIG. 5 of the drawing shows a system 44 for measuring shoe length of the stylus 10. The system comprises means attached to a stylus 10 for positioning the tip 16 of the stylus 10 adjacent the surface of the information record 14. In the present embodiment, the positioning means comprises a tracking arm 46 enclosed in a pickup cartridge 48 which is held in an armlike housing 50, as shown in FIG. 6. The tracking arm 46 holds the tip 16 of the stylus 10 adjacent the record 14 while it tracks the groove 20. The record 14 rotates on a turntable 52 mounted on a motor board 54. The system 14 also includes means for changing the orientation of the stylus 10 relative to the record 14 an angle of $\theta$ degrees about an axis passing through the base 26 of the prow 24 in a direction parallel to the surface 12 of the record 14 and perpendicular to the direction of the shoe length, in order to change the orientation from the first position to the second position. Such means may comprise any type of pivoting means 56 for tilting the cartridge 48 relative to the housing 50.

Also connected to the stylus 10 via the electrode 40 is circuit means for measuring the capacitive variations between the stylus 10 and the record 14 while they are oriented in the first and the second positions to obtain the first and the second signals, respectively. In the present embodiment, the circuit means comprises a resonant circuit, including the stylus-record capacitance, excited by an oscillator with a frequency on the slope of the resonant curve for the circuit at about 915 MHz. The circuit means further comprises circuit pickup means for detecting the point where the oscillator frequency falls on the resonant curve in a manner such that the detected carrier of the circuit pickup means is amplitude modulated. The response to the excitation may be detected with a pickup loop. The magnitude of the detected response will depend upon where the oscillator frequency falls on the resonance curve. As the stylus-record capacitance changes, the resonant frequency will change such that the detected carrier will be amplitude modulated, and the voltage obtained by peak detection of this carrier represents the stylus-record capacitance. Such circuit means is further described in detail in U.S. Pat. No. 4,080,625, issued to H. Kawamoto et al. on Mar. 21, 1978, and U.S. Pat. No. 3,872,265, issued to S. E. Hilliker on Mar. 18, 1975, both assigned to RCA Corporation, which are incorporated herein by reference.

Both the first and the second signals obtained by the pickup circuitry are split between a first filter 58 and a second filter 60 passing only the first and the second centered frequencies, respectively, as shown in FIG. 5. Each of the two distinct filtered signals is then passed through a detector and a logarithmic amplifier before being subtracted from each either to obtain the aperture signal $\Delta G$. In the present example, an HP 3575A gain-phase meter 62, available from Hewlett Packard Corporation, Palo Alto, Calif., was used for the detectors and logarithmic amplifiers.

The aperture signals, $\Delta G_1$ and $\Delta G_2$, associated with the first and second positions, respectively, are obtained by subtraction using a differential amplifier 64. In the present example, the first aperture signal, $\Delta G$, is stored in a hold circuit 66, and then fed to comparing means 68 comprising another differential amplifier, to obtain a difference signal proportional to the shoe length of the stylus 10.

The system 44 may further comprise separate means 70 for lapping the tip 16 of the stylus 10, along with processing means for comparing the difference signal with a predetermined or final value, and for terminating the lapping when the difference signal equals the predetermined value. The lapping means 70 may comprise simply an abrasive groove, as further described in U.S. Pat. No. 4,104,832, issued to E. O. Keizer et al., on Aug. 8, 1978 and assigned to RCA Corporation, which is incorporated herein by reference. Such an abrasive groove may be either in the information record 14 itself, or at a separate lapping station having a second independent turntable. For example, the cartridge 48 may be placed first in a separate lapping station. Then it is physically removed by some mechanical means and placed in the shoe length measuring station where the tilting is performed. The difference signal is fed to the processing means which decides to either return the cartridge 48 to the lapping station for more lapping, or move it to the next station in line.

The processing means may compare the difference signal, $\Delta G_1 - \Delta G_2$, with the final predetermined value by using a differential amplifier 72 connected to a potentiometer 74, set for the final value of $\Delta G_1 - \Delta G_2$, to obtain a sampling signal. The magnitude of this sampling signal may then be utilized by a flip-flop 76 either for stopping the lapping at the final desired shoe length, or for obtaining a new difference signal, $\Delta G_1 - \Delta G_2$, after a specific time delay (determined by the magnitude of the samping signal) at the lapping means 70. The delay gets shorter as $\Delta G_1 - \Delta G_2$ approaches the final value that corresponds to the desired 4 micrometer shoe length. The above comparing and processing steps may also be accomplished by a microcomputer system 78 using a microprocessor, such as the RCA COSMAC CDP 1802.

The present invention provides a novel technique for rapidly measuring the shoe lenth of video disc playback styli. Such a measurement system is particularly suitable for controlling or measuring the stylus shoe length during high volume production or testing of the styli.

What is claimed is:

1. A method of measuring shoe length of a stylus having a tip at one end thereof, said tip including a prow terminating at a base thereof and a stern remote from said prow, said tip adapted to track a path along a surface of an information record and to measure capacitive variations between said stylus and the surface of said record when relative motion is established between said stylus and said record, the shoe length being the distance between said base and said stern along a line tangent to said path at the tracking location, comprising the steps of:

positioning the tip of said stylus adjacent the surface of a substrate to allow capacitive coupling, between said stylus and said substrate acting as capacitive electrodes, to produce an output signal at one capacitive electrode in response to an input signal at the other capacitive electrode, measuring the amplitude of said output signal while said stylus and said substrate are oriented in a first position to obtain a first signal, changing the orienton of said stylus relative to said substrate an angle of $\theta$ degrees about an axis passing through the base of said prow in a direction parallel to the surface of said substrate and perpendicular to the direction of said shoe length, in order to change the distance of said stern from said substrate, whereby said stylus and said substrate are oriented in a second position relative to each other, measuring the amplitude of said output signal while said stylus and said substrate are oriented in said second position to obtain a second signal, and comparing said first signal with said second signal to obtain a difference signal proportional to the shoe length of said stylus.

2. A method as recited in claim 1 wherein said substrate comprises the other capacitive electrode and has an input signal therein for effecting capacitive variations between said stylus and said substrate, and wherein each of said measuring steps is performed by measuring the capacitive variations between said stylus and said substrate.

3. A method as recited in claim 2 wherein said signal occupies a bandwidth of several MHz including lower and upper sidebands of equal amplitude centered at a first and a second frequency, respectively, and wherein each of the measuring steps is performed by splitting the recovered signal between a first and a second filter passing only said first and said second centered frequencies, respectively, to obtain two distinct filtered signals, and then subtracting one filtered signal from the other filtered signal to obtain an aperture signal $\Delta G$.

4. A method as recited in claim 3 wherein said difference signal comprises the difference between the first aperture signal $\Delta G_1$, measured at said first position, and the second aperture signal $\Delta G_2$, measured at said second position, and wherein said method further comprises the step of transmitting the difference signal, $\Delta G_1 - \Delta G_2$, to processing means for comparing said difference signal with a predetermined value.

5. A method as recited in claim 4 further comprising lapping the tip of said stylus, and wherein said processing means terminates said lapping when said difference signal equals said predetermined value.

6. A method as recited in claim 5 wherein said predetermined value comprises a value established to terminate said laping when said shoe length is about 4 $\mu$m.

7. A method as recited in claim 2 wherein said substrate is disposed adjacent a tilting platform, and wherein said changing step is performed by rotating said platform an angle of $\theta$ degrees.

8. A method as recited in claim 2 wherein said stylus is supported by a tracking arm enclosed in a pickup cartridge attached to an armlike housing, and wherein said changing step is performed by tilting said cartridge relative to said housing.

9. A method as recited in claim 2 wherein said first position comprises the normal position during playback characterized by the direction of said shoe length being substantially parallel to the surface of said substrate, and wherein said second position comprises the orientation of said stylus relative to said record being changed an angle of $\theta$ equal to about 2 degrees.

10. A method as recited in claim 2 wherein said substrate comprises an information record including a groove in said surface, said groove having geometric variations of adequate fineness of dimension therein to accommodate recovery of said signal therefrom when relative motion is established between said stylus and said record, and wherein the base of said tip comprises a point adapted to track said groove, and the stern of said tip has an electrode disposed adjacent thereto.

11. A method as recited in claim 10 wherein said information record comprises a video disc containing a base band 1 (BB1) test signal therein comprising a 5 MHz carrier frequency modulated with a 3 MHz sine wave, said 5 MHz carrier frequency having lower and upper sidebands centered at 2 MHz and 8 MHz, respectively.

12. Apparatus for measuring shoe length of a stylus having a tip at one end thereof, said tip including a prow terminating at a base thereof and a stern remote from said prow, said tip adapted to track a path along a surface of an information record and to measure capacitive variations between said stylus and the surface of said record when relative motion is established between said stylus and said record, the shoe length being the distance between said base and said stern along a line tangent to said path at the tracking location, comprising:

means attached to said stylus for positioning the tip of said stylus adjacent the surface of a substrate to allow capacitive coupling, between said stylus and said substrate acting as capacitive electrodes, to produce an output signal at one capacitive electrode in response to an input signal at the other capacitive electrode, means for changing the orientation of said stylus relative to said substrate an angle of $\theta$ degrees about an axis passing through the base of said prow in a direction parallel to the surface of said substrate and perpendicular to the direction of said shoe length, in order to change said orientation from a first position to a second position, circuit means connected to the one capacitive electrode for measuring the amplitude of said output signal while said stylus and said substrate are oriented in said first and said second positions to obtain a first and a second signal respectively, and means connected to said circuit means for comparing said first signal with said second signal to obtain a difference signal proportional to the shoe length of said stylus.

13. An apparatus as defined in claim 12 wherein said positioning means comprises a tracking arm enclosed in a pickup cartridge attached to an armlike housing.

14. An apparatus as defined in claim 13 wherein said changing means comprises pivoting means for tilting said cartridge relative to said housing.

15. An apparatus as defined in claim 12 wherein said changing means comprises a tilting platform, said substrate being disposed adjacent said tilting platform.

16. An apparatus as defined in claim 12 wherein said substrate comprises the other capacitive electrode and has an input signal therein for effecting capacitive variations between said stylus and said substrate, and wherein said circuit means for measuring the amplitude of said output signal comprises circuit means for measuring said capacitive variations between said stylus and said substrate.

17. An apparatus as defined in claim 16 wherein said signal occupies a bandwidth of several MHz including lower and upper sidebands of equal amplitude centered at a first and a second frequency, respectively, and wherein said circuit means for measuring said capacitive variation comprises means for splitting the recovered signal between a first and a second filter passing only said first and said second centered frequencies, respectively, to obtain two distinct filtered signals, and means connected to said first and said second filters for subtracting one filtered signal from the other filtered signal to obtain an aperture signal $\Delta G$.

18. An apparatus as defined in claim 17 wherein said measuring means further comprises a resonant circuit excited by an oscillator with a frequency on the slope of the resonant curve for said circuit at about 915 MHz, and further comprises circuit pickup means for detecting the point where said oscillator frequency falls on said resonant curve in a manner such that the detected carrier of said circuit pickup means is amplitude modulated.

19. An apparatus as defined in claim 16 further comprising means for lapping the tip of said stylus, and processing means for comparing said difference signal with a predetermined value and for terminating said lapping when said difference signal equals said predetermined value.

20. An apparatus as defined in claim 19 wherein said comparing and said processing means comprises a microprocessor for obtaining said difference signal, computing the difference between said difference signal and said predetermined value to obtain a sampling signal, and utilizing the magnitude of said sampling signal for determining a time delay until the next difference signal is obtained.

21. An apparatus as defined in claim 16 wherein said substrate comprises an information record including a groove in said surface, said groove having geometric variations of adequate fineness of dimension therein to accommodate recovery of said signal therefrom when relative motion is established between said styllus and said record, and wherein the base of said tip comprises a point adapted to track said groove, and the stern of said tip has an electrode disposed adjacent thereto.

22. An apparatus as defined in claim 21 wherein said information record comprises a video disc containing a base band one (BB1) test signal therein comprising a 5 MHz carrier frequency modulated with a 3 MHz sine wave, said 5 MHz carrier frequency having lower and upper sidebands centered at 2 MHz and at 8 MHz, respectively.

23. An apparatus as defined in claim 16 wherein said comparing means comprises a differential amplifier.

* * * * *